United States Patent
Wang

(10) Patent No.: US 10,147,787 B1
(45) Date of Patent: Dec. 4, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventor: Tai-Yuan Wang, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/609,229

(22) Filed: May 31, 2017

(51) Int. Cl.
*H01L 29/06* (2006.01)
*H01L 29/78* (2006.01)
*H01L 29/66* (2006.01)
*H01L 21/306* (2006.01)

(52) U.S. Cl.
CPC .... *H01L 29/0653* (2013.01); *H01L 21/30604* (2013.01); *H01L 29/66545* (2013.01); *H01L 29/66795* (2013.01); *H01L 29/7851* (2013.01)

(58) Field of Classification Search
CPC ........... H01L 29/0653; H01L 29/66545; H01L 21/30604; H01L 29/7851; H01L 29/66795
See application file for complete search history.

(56) References Cited

U.S. PATENT DOCUMENTS

| | | | |
|---|---|---|---|
| 8,759,916 B2 * | 6/2014 | Bryant | H01L 29/66742 257/344 |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,431,399 B1 * | 8/2016 | Alptekin | H01L 27/0924 |
| 9,520,482 B1 | 12/2016 | Chang et al. | |
| 9,576,814 B2 | 2/2017 | Wu et al. | |
| 9,755,019 B1 * | 9/2017 | Fung | H01L 21/823814 |
| 9,768,178 B2 * | 9/2017 | Lee | H01L 27/1104 |
| 9,818,872 B2 * | 11/2017 | Ching | H01L 29/7848 |
| 9,837,511 B2 * | 12/2017 | Tung | H01L 29/66795 |
| 9,853,111 B2 * | 12/2017 | Choi | H01L 29/41791 |
| 9,853,154 B2 * | 12/2017 | Chang | H01L 29/7848 |
| 9,859,434 B2 * | 1/2018 | Zhu | H01L 29/66795 |
| 2011/0193141 A1 * | 8/2011 | Lin | H01L 29/045 257/255 |
| 2015/0004726 A1 * | 1/2015 | Konishi | H01L 33/501 438/27 |
| 2017/0098648 A1 * | 4/2017 | Lee | H01L 21/823431 |
| 2017/0133286 A1 * | 5/2017 | Sung | H01L 22/30 |
| 2017/0133386 A1 * | 5/2017 | Lee | H01L 21/823807 |

(Continued)

*Primary Examiner* — Jarrett Stark
(74) *Attorney, Agent, or Firm* — McClure, Qualey & Rodack, LLP

(57) ABSTRACT

A semiconductor structure includes a semiconductor substrate, at least one source drain structure, an insulating layer, and a gate. The semiconductor substrate includes a base portion and at least one fin. The fin is disposed on the base portion. The source drain structure is disposed on at least one sidewall of the fin. The insulating layer is disposed between the base portion and the source drain structure to isolate the base portion and the source drain structure. The gate is disposed on the fin.

20 Claims, 7 Drawing Sheets

(56) References Cited

U.S. PATENT DOCUMENTS

| | | | |
|---|---|---|---|
| 2017/0243944 A1* | 8/2017 | Li | H01L 29/0649 |
| 2017/0287910 A1* | 10/2017 | Fung | H01L 27/0886 |
| 2017/0323795 A1* | 11/2017 | Li | H01L 21/3065 |
| 2017/0345933 A1* | 11/2017 | Fung | H01L 21/02532 |
| 2018/0006039 A1* | 1/2018 | Lee | H01L 29/0847 |

* cited by examiner

SEMICONDUCTOR STRUCTURE AND MANUFACTURING METHOD THEREOF

BACKGROUND

Double-gate metal-oxide-semiconductor field-effect transistors (MOSFETs) are MOSFETs that incorporate two gates into one device. These devices are also called fin-shaped field effect transistors (FinFETs) due to their structure including a thin "fin" extending from a substrate. Silicon based FinFETs can be fabricated using MOSFET technology. A FinFET is fabricated on a substrate with an overlying insulating layer with a thin "fin" extending from the substrate, for example, etched into a silicon layer of the substrate. The channel of the field effect transistor (FET) is formed in this vertical fin. A gate is provided over (e.g., wrapping) the fin. The double gate is beneficial in that there is a gate on both sides of the channel allowing gate control of the channel from both sides. FinFETs further reduce the short channel effect and have high current flow. Other FinFET architectures may include three or more effective gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
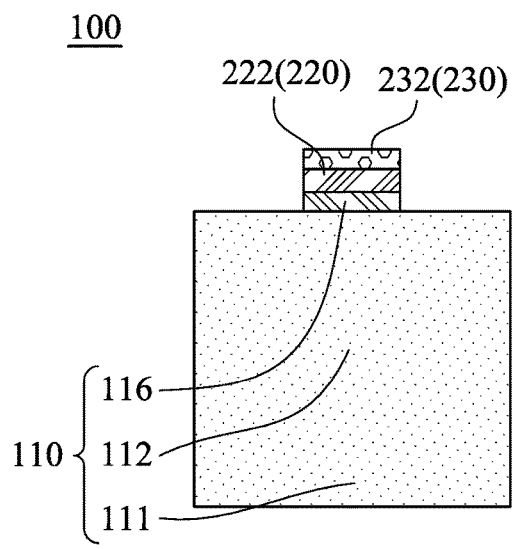
FIGS. 1A-6D are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A-6D are cross-sectional views of a method for manufacturing a semiconductor structure 100 at various stages in accordance with some embodiments of the present disclosure.

Figure 1B:
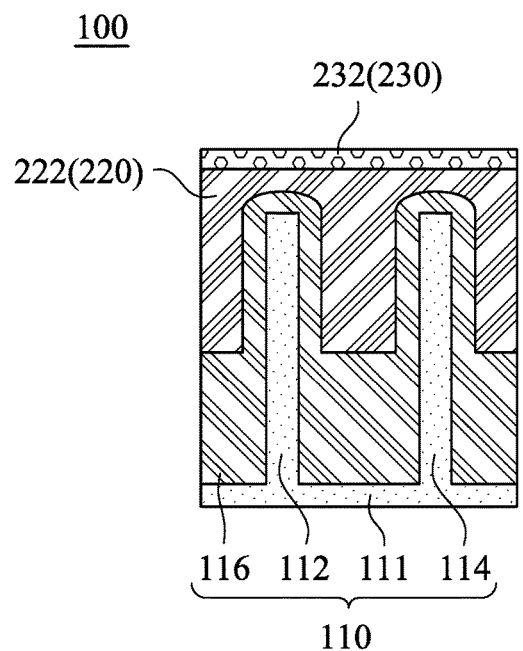
Figure 1C:
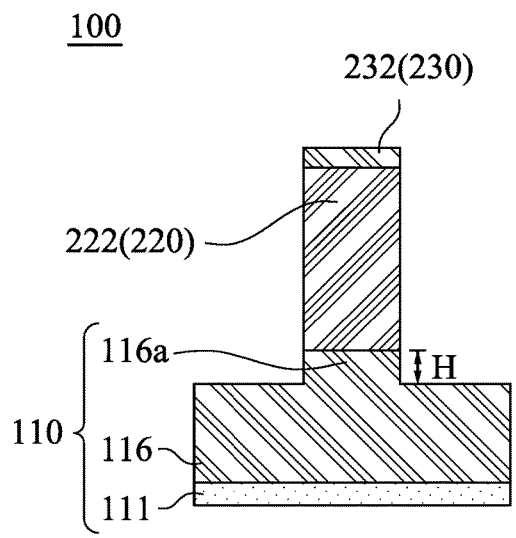

Reference is made to FIGS. 1A-1C, in which FIG. 1A is a cross-sectional view of a first fin 112 of the semiconductor structure 100 viewed along a first direction, FIG. 1B is a cross-sectional view of the first fin 112 and a second fin 114 of the semiconductor structure 100 viewed along a second direction, in which the second direction is perpendicular to the first direction, and FIG. 1C is a cross-sectional view of a dummy gate 222 of the semiconductor structure 100 viewed along the first direction. A semiconductor substrate 110 is provided. The semiconductor substrate 110 includes a base portion 111, at least one first fin 112, and at least one second fin 114. The first fin 112 and the second fin 114 are disposed on the base portion 111.

In some embodiments, the first fin 112 and the second fin 114 include silicon. It is note that the numbers of the first fin 112 and the second fin 114 in FIG. 1B are illustrative and should not limit various embodiments of the present disclosure. A person having ordinary skill in the art may select suitable numbers for the first fin 112 and the second fin 114 according to actual situations.

In some embodiments, the semiconductor substrate 110 may be made of a semiconductor material and may include, for example, a graded layer or a buried oxide therein. In some embodiments, the semiconductor substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the semiconductor substrate 110. Alternatively, the semiconductor substrate 110 may be an active layer of a semiconductor-on-insulator (SOI) substrate or a multi-layered structure such as a silicon-germanium layer formed on a bulk silicon layer.

The first fin 112 and the second fin 114 may be formed by, for example, patterning and etching the semiconductor substrate 110 using photolithography techniques. In some embodiments, a layer of photoresist material (not shown) is formed over the semiconductor substrate 110. The layer of photoresist material is irradiated (or exposed) in accordance with a pattern (the first fin 112 and the second fin 114) and developed to remove a portion of the photoresist material. The remaining photoresist material protects the underlying material from subsequent processing steps, such as etching. Then, an etching process is performed to form the first fin 112 and the second fin 114. It should be noted that other masks, such as an oxide or silicon nitride mask, may also be used in the etching process.

In some other embodiments, the first fin 112 and the second fin 114 may be epitaxially grown. For example, exposed portions of an underlying material, such as exposed portions of the semiconductor substrate 110, may be used in an epitaxial process to form the first fin 112 and the second fin 114. A mask may be used to control the shape of the first fin 112 and the second fin 114 during the epitaxial growth process.

Then, at least one shallow trench isolation (STI) structure 116 is formed between the first fin 112 and the second fin 114 and on the base portion 111. The STI structure 116 may be formed by filling trenches between the first fin 112 and the second fin 114 with a flowable dielectric material, curing the flowable dielectric material, and then recessing the cured dielectric material. In yet some other embodiments, the STI structure 116 are insulator layers of a SOI wafer.

Then, a dummy gate layer 220 is formed on the STI structure 116. Specifically, the dummy gate layer 220 is deposited and then planarized. The dummy gate layer 220 may include, for example, polysilicon, amorphous silicon, or the like. The deposition of the dummy gate layer 220 is performed by chemical vapor deposition (CVD), physical vapor deposition (PVD), other suitable processes, or combinations thereof. The planarization of the dummy gate layer 220 is performed by chemical mechanical polishing.

Then, a stop layer 230 is formed on the dummy gate layer 220. The stop layer 230 may include, for example, silicon nitride, titanium nitride, or the like. The stop layer 230 may be formed using chemical vapor deposition (CVD), physical vapor deposition (PVD), atomic layer deposition (ALD), other suitable processes, or combinations thereof. Additional layers, for example, a hard mask layer, may also be formed on the dummy gate layer 220.

Then, the stop layer 230 and the dummy gate layer 220 are patterned and etched to define a patterned stop layer 232 and at least one dummy gate 222 using photolithography techniques. The etching process may include a dry etching process. In some other embodiments, the dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Then, an upper portion of the STI structure 116 uncovered by the dummy gate 222 is removed by an etching process, such that at least one protruding portion 116a of the STI structure 116 is formed below the dummy gate 220. In some embodiments, the height H of the protruding portion 116a is in a range from about 5 nm to about 8 nm. The etching process may be performed during or after the process of etching the dummy gate layer 220. The etching process may include a dry etching process. In some other embodiments, the dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 2A:
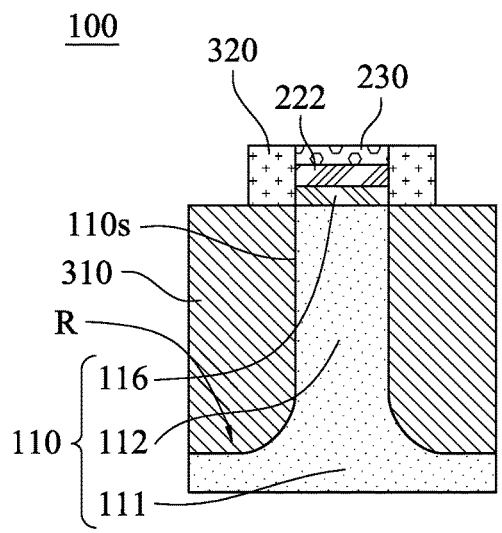
Figure 2B:
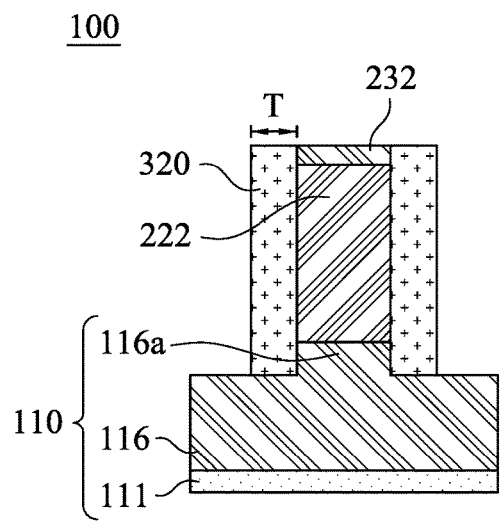
Figure 2C:
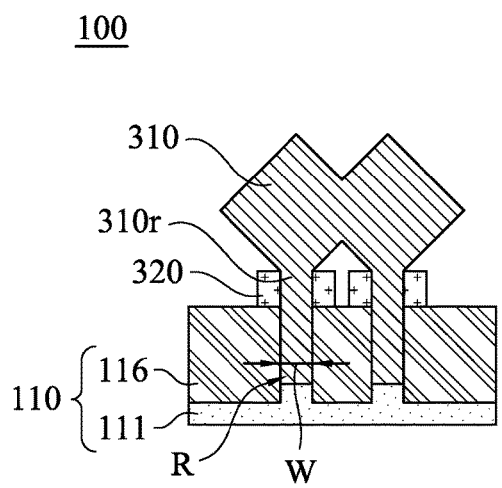

Reference is made to FIGS. 2A-2C, in which FIG. 2A is a cross-sectional view of the first fin 112 of the semiconductor structure 100 viewed along the first direction, FIG. 2B is a cross-sectional view of the dummy gate 222 of the semiconductor structure 100 viewed along the first direction, and FIG. 2C is a cross-sectional view of a source drain structure 310 of the semiconductor structure 100 viewed along the second direction. A plurality of spacers 320 are formed on sidewalls of the dummy gate 222, sidewalls of the protruding portion 116a of the STI structure 116, and the sidewalls of the first fin 112 and the second fin 114 (see FIG. 1B). The thickness T of the spacers 320 may be in a range from about 7 nm to about 10 nm. In some embodiments, at least one of the spacers 320 includes silicon nitride, silicon oxynitride, or other dielectric materials. The available formation methods include plasma enhanced chemical vapor deposition (PECVD), low-pressure chemical vapor deposition (LPCVD), sub-atmospheric chemical vapor deposition (SACVD), and other deposition methods.

Portions of the first fin 112 and the second fin 114 are partially removed (or partially recessed) to form recesses R between the spacers 320 and the STI structures 116. The width W of the recesses R may be in a range from about 8 nm to about 12 nm. In some embodiments, sidewalls of the recesses R are substantially vertically parallel to each other. In some other embodiments, the recesses R are formed with a non-vertical parallel profile.

The recessing process may include a dry etching process, a wet etching process, and/or combinations thereof. The recessing process may also include a selective wet etching process or a selective dry etching process. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Then, a plurality of source drain structures 310 are respectively formed in the recesses R and on the base portion 111. The source drain structures 310 protrude from the recesses R. The source drain structure 310 includes a root portion 310r disposed in the recess R and a head portion 310h protrudes from the recess R and on the root portion 310r. In some embodiments, the root portions 310r of the source drain structures 310 are separated from each other, and the head portions 310h of the source drain structures 310 are merged together. The source drain structures 310 are formed on sidewalls 110s of the first fin 112 and the second fin 114. In some embodiments, lattice constants of the source drain structures 310 are different from lattice constants of the first fin 112 and the second fin 114 (see FIG. 1B), and thus the first fin 112 and the second fin 114 are strained or stressed to enhance carrier mobility of the semiconductor device and the device performance. The source drain structures 310 may be formed using a cyclic deposition and etching (CDE) process. The CDE process includes an epitaxial deposition/partial etch process and repeating the epitaxial deposition/partial etch process at least once.

In some embodiments that the resulting metal-oxide-semiconductor (MOS) device is an nMOS device, the source drain structures 310 may be n-type epitaxy structures. In some embodiments that the resulting MOS device is a pMOS device, the source drain structures 310 may be p-type epitaxy structures. The n-type epitaxy structures may be made of SiP, SiC, SiPC, Si, III-V compound semiconductor materials, or combinations thereof, and the p-type epitaxy structures may be made of SiGe, SiGeC, Ge, Si, III-V compound semiconductor materials, or combinations thereof. During the formation of the n-type epitaxy structures, n-type impurities such as phosphorous or arsenic may be doped with the proceeding of the epitaxy. For example, when the n-type epitaxy structures include SiC or Si, n-type impurities are doped. Moreover, during the formation of the p-type epitaxy structures, p-type impurities such as boron or $BF_2$ may be doped with the proceeding of the epitaxy. For example, when the p-type epitaxy structures include SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the first fin 112 and the second fin 114 (e.g., silicon). Thus, a strained channel can be achieved to increase carrier mobility and enhance device performance. The source drain structures 310 may be in-situ doped. If the source drain structures 310 are not in-situ doped, a second implantation process (i.e., a junction implant process) is performed to dope the source drain structures 310. One or more annealing processes may be performed to activate the source drain structures 310. The annealing processes include rapid thermal annealing (RTA) and/or laser annealing processes.

Figure 3A:
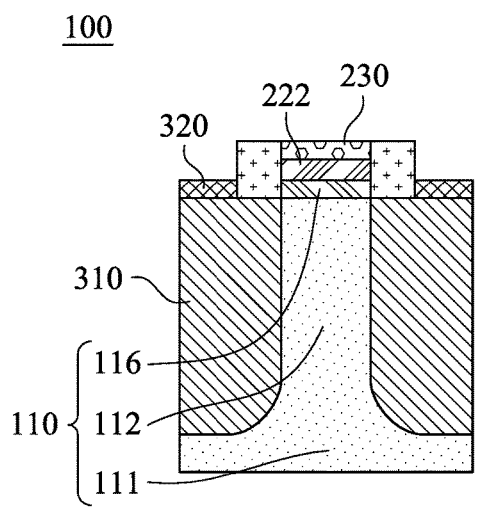
Figure 3B:
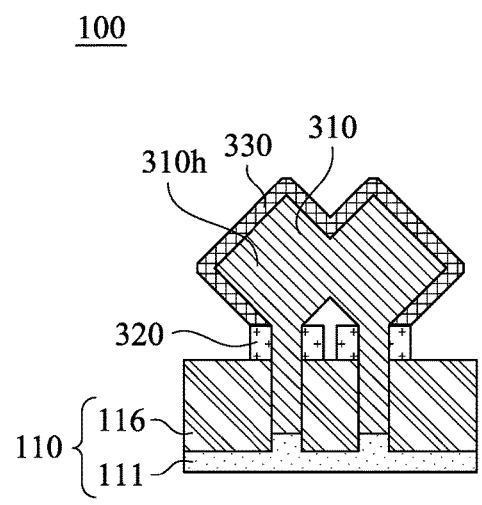

Reference is made to FIGS. 3A and 3B, in which FIG. 3A is a cross-sectional view of the first fin 112 of the semiconductor structure 100 viewed along the first direction and FIG. 3B is a cross-sectional view of the source drain structure 310 of the semiconductor structure 100 viewed along the second direction. A plurality of caps 330 are formed to cover the head portions 310h of the source drain structures 310. The caps 330 may be made of undoped polysilicon or undoped amorphous silicon. The caps 330 may be formed by ALD, CVD, plasma-enhanced chemical vapor deposition (PECVD), high density chemical vapor deposition (HDCVD), PVD, and the like.

Figure 4A:
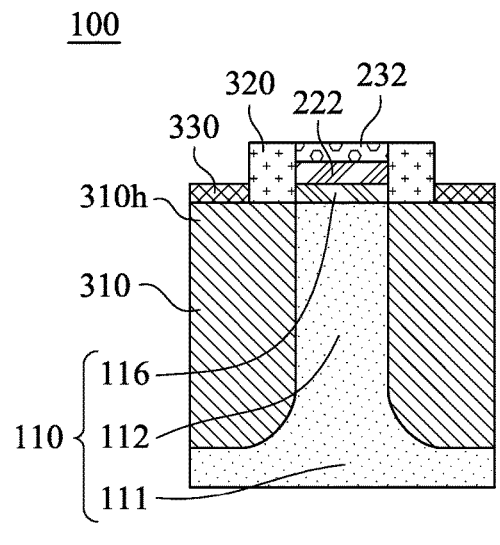
Figure 4B:
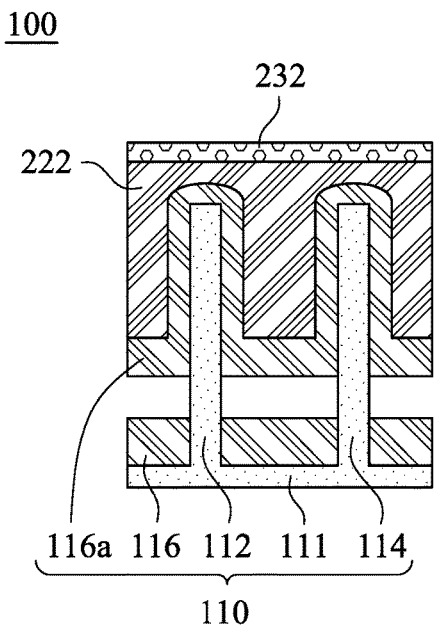
Figure 4C:
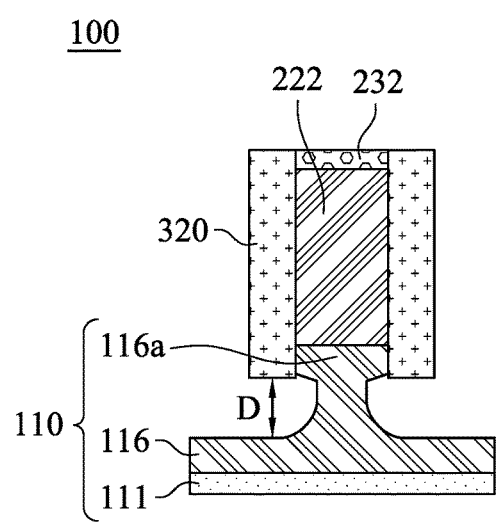
Figure 4D:
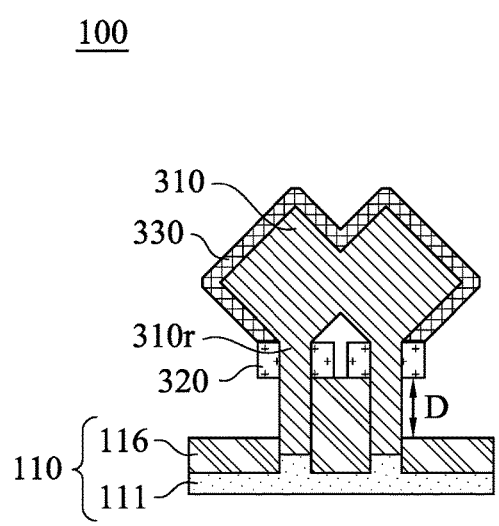

Reference is made to FIGS. 4A-4D, in which FIG. 4A is a cross-sectional view of the first fin 112 of the semiconductor structure 100 viewed along the first direction, FIG. 4B is a cross-sectional view of the first fin 112 and the second fin 114 of the semiconductor structure 100 viewed along the second direction, FIG. 4C is a cross-sectional view of the dummy gate 222 of the semiconductor structure 100 viewed along the first direction, and FIG. 4D is a cross-sectional view of the source drain structures 310 of the semiconductor structure 100 viewed along the second direction. At least a part of the STI structures 116 is removed, such that lower parts of the root portions 310r of the source drain structures 310 (the lower portions of the source drain structures 310) are exposed. In some embodiments, after the part of the STI structure 116 is removed, at least a part of the protruding portion 116a of the STI structure 116, which is disposed between the spacers 320, is not removed, and the distance D between the spacers 320 and the remaining STI structure 116 is in a range from about 10 nm to about 15 nm. It is noted that the protruding portion 116a of the STI structure 116 is still connected to the portion of the STI structure 116 disposed on the base portion 111.

The part of the STI structure 116 may be removed by a selective dry etching process, a selective wet etching process, and/or combinations thereof. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 5A:
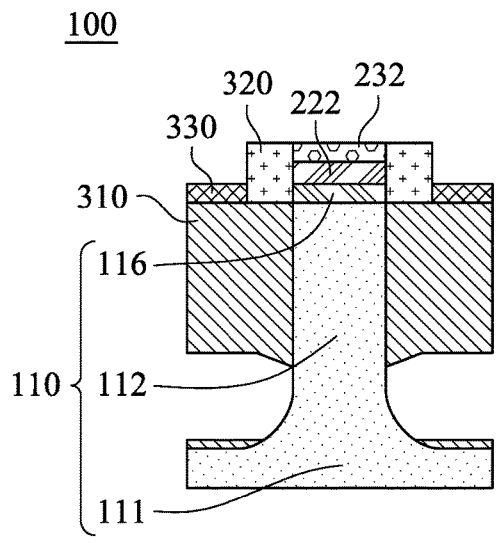
Figure 5B:
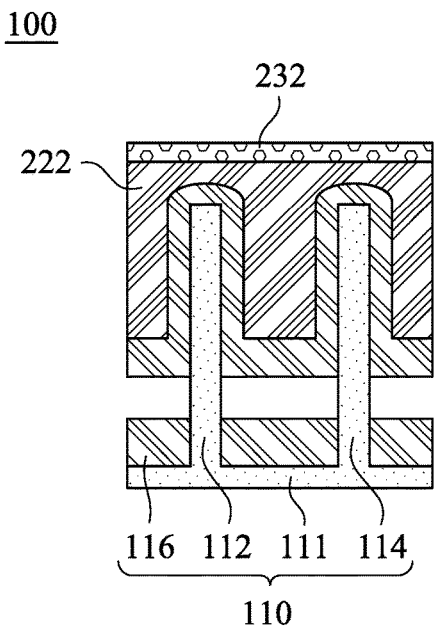
Figure 5C:
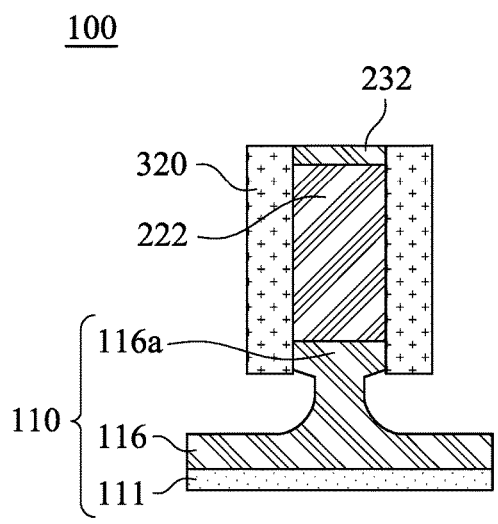
Figure 5D:
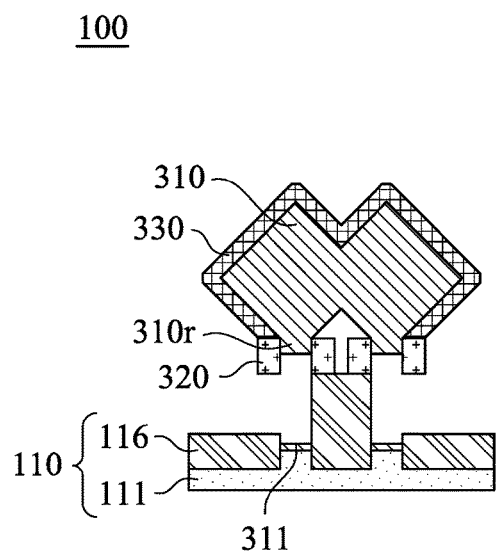

Reference is made to FIGS. 5A-5D, in which FIG. 5A is a cross-sectional view of the first fin 112 of the semiconductor structure 100 viewed along the first direction, FIG. 5B is a cross-sectional view of the first fin 112 and the second fin 114 of the semiconductor structure 100 viewed along the second direction, FIG. 5C is a cross-sectional view of the dummy gate 222 of the semiconductor structure 100 viewed along the first direction, and FIG. 5D is a cross-sectional view of the source drain structure 310 of the semiconductor structure 100 viewed along the second direction. Lower parts of the root portions 310r of the source drain structures 310 (the lower portions of the source drain structures 310) are removed.

The lower parts of the root portions 310r of the source drain structures 310 may be removed by a selective wet etching process. In some other embodiments, a wet etching solution may include $NH_4OH$, KOH (potassium hydroxide), HF (hydrofluoric acid), TMAH (tetramethylammonium hydroxide), other suitable wet etching solutions, or combinations thereof.

It is noted that the caps 330 can protect the source drain structures 310 from being removed by the etching process. In addition, since the selective wet etching process is an isotropic etching process, a part of the root portion 310r of the source drain structure 310 on the spacer 320 is removed.

The remaining source drain structures 310 are connected to the base portion 111 of the semiconductor substrate 110 through the spacers 320 and the STI structure 116 or the first fin 112 and the second fin 114. Some of the source drain structure 310 (the residue doped region 311) are remained on the base portion 111 and between the STI structures 116.

Figure 6A:
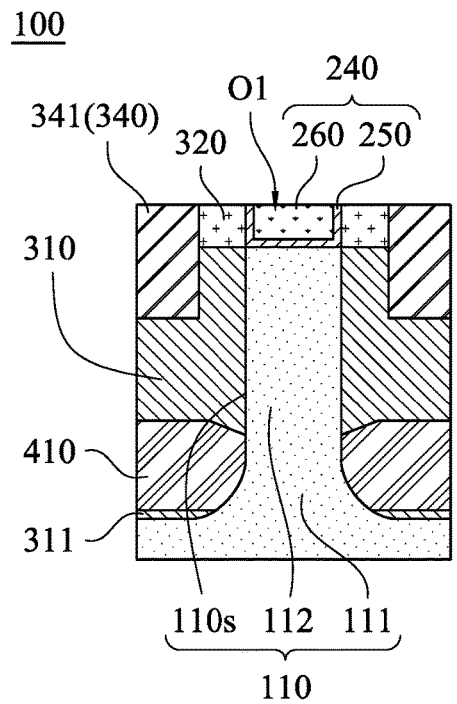
Figure 6B:
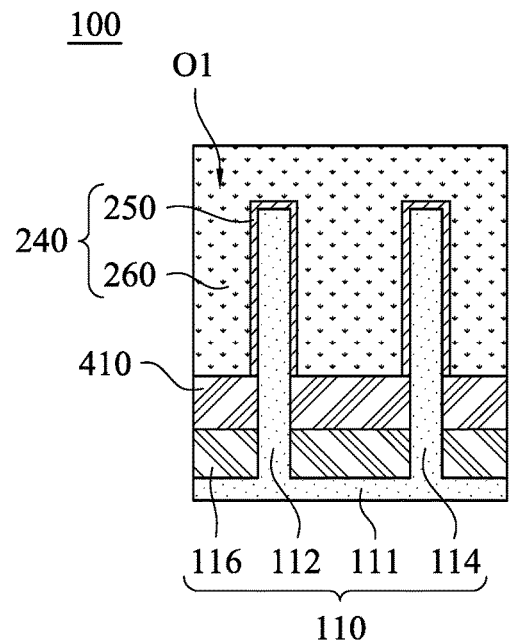
Figure 6C:
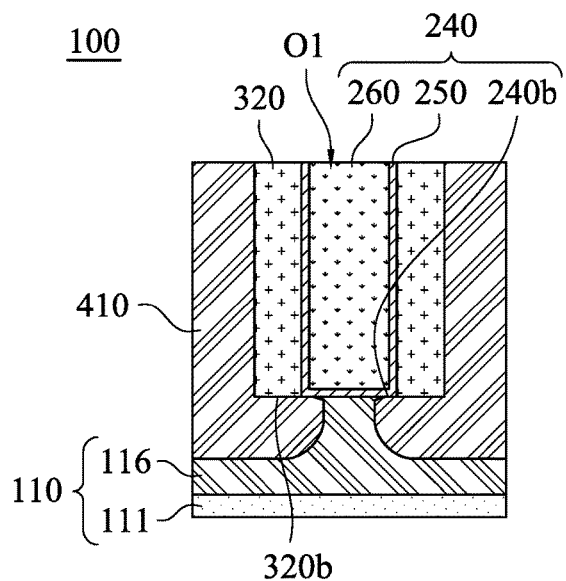
Figure 6D:
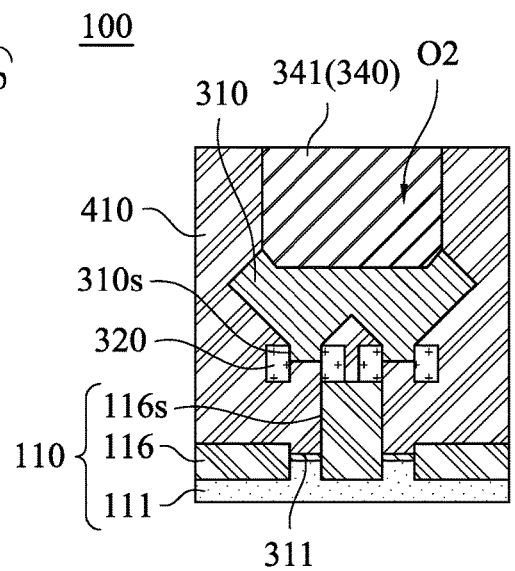

Reference is made to FIGS. 5A-5D and FIGS. 6A-6D, in which FIG. 6A is a cross-sectional view of the first fin 112 of the semiconductor structure 100 viewed along the first direction, FIG. 6B is a cross-sectional view of the first fin 112 and the second fin 114 of the semiconductor structure 100 viewed along the second direction, FIG. 6C is a cross-sectional view of a gate 240 of the semiconductor structure 100 viewed along the first direction, and FIG. 6D is a cross-sectional view of the source drain structure 310 of the semiconductor structure 100 viewed along the second direction. The caps 330 are removed. The caps 330 may be removed by a selective wet etching process. In some other embodiments, a wet etching solution may include NH$_4$OH, KOH (potassium hydroxide), HF (hydrofluoric acid), TMAH (tetramethylammonium hydroxide), other suitable wet etching solutions, or combinations thereof.

Then, an insulating layer 410 is formed at least between the source drain structures 310 and the base portion 111. The insulating layer 410 may also be formed between the source drain structures 310 and the STI structure 116 and cover the source drain structures 310. The insulating layer 410 may function as an inter-layer dielectric (ILD). The insulating layer 410 may include a flowable dielectric material formed using, for example, flowable chemical vapor deposition (FCVD). The insulating layer 410 may also be a spin-on glass formed using spin-on coating. The insulating layer 410 may be made of, for example, SiO$_2$ (silicon dioxide).

Then, a planarization step is performed by, for example, chemical mechanical polishing (CMP). The CMP is performed to remove excess portions of the insulating layer 410, the remaining patterned stop layer 232, and excess portions of the spacers 320.

Then, the dummy gate 222 is removed. The dummy gate 222 may be removed by a selective wet etching process. In some other embodiments, a wet etching solution may include NH$_4$OH, KOH (potassium hydroxide), HF (hydrofluoric acid), TMAH (tetramethylammonium hydroxide), other suitable wet etching solutions, or combinations thereof.

Then, the protruding portion 116a of the STI structure 116 is removed. Therefore, at least one opening O1 is formed as a result of the removal of the dummy gates 222 and the protruding portion 116a of the STI structure 116. It is noted that the depth of the opening can be adjusted by removing the protruding portion 116a of the STI structure 116.

The protruding portion 116a of the STI structure 116 may be removed by a selective wet etching process. In some other embodiments, a wet etching solution may include NH$_4$OH, KOH (potassium hydroxide), HF (hydrofluoric acid), TMAH (tetramethylammonium hydroxide), other suitable wet etching solutions, or combinations thereof.

Then, at least one gate 240 is formed in the opening O1, such that the gate 240 is disposed on the first fin 112 and the second fin 114. In other words, the dummy gate 222 is replaced with the gate 240. In addition, the spacers 320 are disposed on sidewalls of the gate 240.

Specifically, in some embodiments, a gate dielectric layer 250, a diffusion barrier layer (not shown in Figs.), a metal layer (not shown in Figs.), a block layer (not shown in Figs.), a wetting layer (not shown in Figs.), and a filling metal (not shown in Figs.) are sequentially formed in the opening O1.

Then, a planarization step (for example, chemical mechanical polish (CMP)) is performed to remove excess portions of the gate dielectric layer 250, the diffusion barrier layer, the metal layer, the block layer, the wetting layer, and the filling metal, in which the excess portions are over the insulating layer 410. Therefore, the remaining portions of the diffusion barrier layer, the metal layer, the block layer, the wetting layer, and the filling metal form a gate electrode 260, and the remaining portions of the gate dielectric layer 250 and the gate electrode 260 form the gate 240. In other words, the gate 240 may include the gate dielectric layer 250, the diffusion barrier layer, the metal layer, the block layer, the wetting layer, and the filling metal, or the gate 240 may include the gate dielectric layer 250 and the gate electrode 260.

In some embodiments, the gate dielectric layer 250 includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer 250 may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer), and a TaN layer (the upper part of the diffusion barrier layer) over the TiN layer.

When the gate 240 forms n-type metal-oxide-semiconductor (MOS) devices, the metal layer is in contact with the diffusion barrier layer. For example, in the embodiments in which the diffusion barrier layer includes a TiN layer and a TaN layer, the metal layer may be in physical contact with the TaN layer. In alternative embodiments in which the gate 240 forms p-type metal-oxide-semiconductor (MOS) devices, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed to fully fill the remaining opening O1. The formation of the wetting layer improves the wetting of the filling metal to the underlying layers.

Then, at least one opening O2 is formed in the insulating layer 410 to expose the source drain structure 310. The opening O2 is formed by a photolithography and etching process.

Then, a conductive layer 340 overfills the opening O2, and then the excess conductive layer 340 outside of the opening O2 is removed. The conductive layer 340 is made of metal, such as copper (Cu), aluminum (Al), tungsten (W), nickel (Ni), cobalt (Co), titanium (Ti), platinum (Pt), tantalum (Ta), or combinations thereof. The conductive layer 340 is formed by, for example, electrochemical deposition, physical vapor deposition (PVD), chemical vapor deposition (CVD), or combinations thereof.

The excess conductive layer 340 outside of the opening O2 is removed through a removal process. In some embodiments, the conductive layer 340 over burden is removed by a chemical mechanical polishing (CMP) process. In some embodiments, when the conductive layer 340 is made of copper (Cu), the CMP slurry is made of, for example, a mixture of suspended abrasive particles, an oxidizer, and a corrosion inhibitor, and the CMP slurry is acidic. After the CMP process, at least one conductive plug 341 (the conductive layer 340) is formed in the opening O2. The conductive plug 341 is electrically connected to the source drain structure 310.

Figure 7:
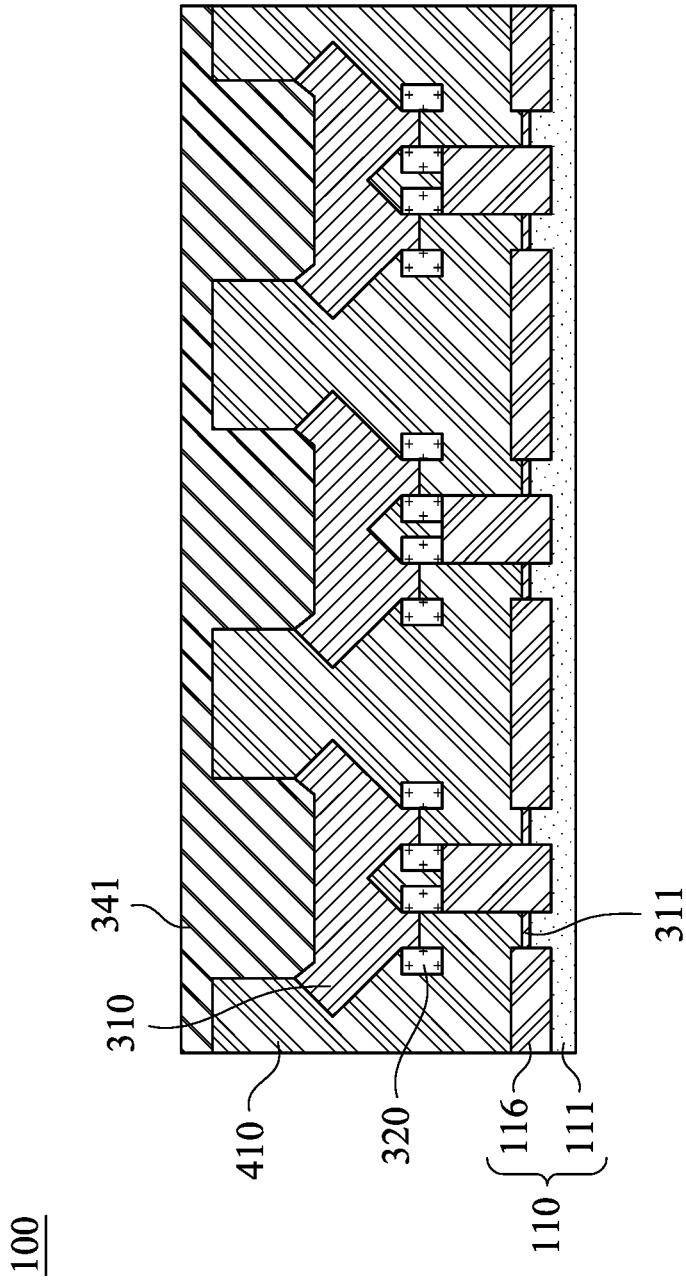
FIG. 7 is a cross-sectional view of a source drain structure of the semiconductor structure in accordance with some embodiments of the present disclosure.

FIG. 7 is a cross-sectional view of the source drain structures 310 of the semiconductor structure 100 viewed along the second direction in accordance with some embodiments of the present disclosure. Reference is made to FIG. 7. The semiconductor structure 100 of FIG. 7 is similar to the semiconductor structure 100 of the aforementioned embodiments, and the main difference between the two is that, in the aforementioned embodiments, two fins (the first fin 112 and the second fin 114) correspond to one gate (the gate 240), and in FIG. 7, six fins are connected to one gate. Therefore, the semiconductor structure 100 includes three source drain structures 310 on one side of the fins.

Reference is made to FIGS. 6A-6D. In another aspect of the present disclosure, a semiconductor structure 100 is provided. The semiconductor structure 100 includes a semiconductor substrate 110, at least one source drain structure 310, at least one spacer 320, an STI structure 116, an insulating layer 410, and a gate 240. The semiconductor substrate 110 includes a base portion 111, at least one first fin 112, and at least one second fin 114. The first fin 112 is disposed on the base portion 111. The second fin 114 is disposed on the base portion 111. The source drain structure 310 is disposed on at least one sidewall 110s of at least one of the first fin 112 and the second fin 114. The spacer 320 is disposed on at least one sidewall 310s of the source drain structure 310. The STI structure 116 is disposed between the spacer 320 and the base portion 111 and between the first fin 112 and the second fin 114. The insulating layer 410 is disposed between the base portion 111 and the source drain structure 310 and between the STI structure 116 and the source drain structure 310. The gate 240 is disposed on at least one of the first fin 112 and the second fin 114.

In some embodiments, the source drain structure 310 is doped. Embodiments of this disclosure are not limited thereto. The person having ordinary skill in the art can make proper modifications to the source drain structure 310 depending on the actual application.

Specifically, the spacer 320 protrudes from the source drain structure 310 toward the base portion 111. That is, at least a portion of the insulating layer 410 is disposed between the spacers 320. A bottom surface 320b of the spacer 320 is in contact with the insulating layer 410. The spacer 320 can be made of silicon nitride. Embodiments of this disclosure are not limited thereto. The person having ordinary skill in the art can make proper modifications to the spacer 320 depending on the actual application.

The STI structure 116 may be made of silicon oxide or silicon nitride. Embodiments of this disclosure are not limited thereto. The bottom surface 320b of the spacer 320 is separated from the STI structure 116. At least another portion of the insulating layer 410 is disposed between the spacer 320 and the STI structure 116, and the insulating layer 410 is in contact with at least one sidewall 116s of the STI structure 116. The person having ordinary skill in the art can make proper modifications to the STI structure 116 depending on the actual application.

The insulating layer 410 is in contact with a bottom surface 240b of the gate 240, the first fin 112, and the second fin 114. The insulating layer 410 may be made of silicon dioxide. Embodiments of this disclosure are not limited thereto. The person having ordinary skill in the art can make proper modifications to the insulating layer 410 depending on the actual application.

Further, the semiconductor structure 100 further includes at least one residue doped region 311. The residue doped region 311 is disposed between the base portion 111 and a portion of the insulating layer 410 disposed under the source drain structure 310. That is, the insulating layer 410 covers the residue doped region 311. In addition, the STI structure 116 is disposed adjacent to the residue doped region 311.

In some embodiments of the present disclosure, because the insulating layer 410 is disposed between the base portion 111 and the source drain structure 310, current leakage from the source drain structure 310 to the base portion 111 can be prevented. Further, since the source drain structure 310 does not protrude into the base portion 111, short-channel effect will not happen.

In addition, because of the different manufacturing processes, the source drain structure 310, which is highly doped, contacts the first fin 112 and the second fin 114. Therefore, the resistance between the source drain structure 310 and the fin is lowered. Further, the source drain structure 310 is rectangle-shaped, and the lower part of the source drain structure 310 contacts the first fin 112 and the second fin 114. Therefore, the fin usage will be enhanced (especially for the lower part of the fin).

According to some embodiments of the present disclosure, a semiconductor structure includes a semiconductor substrate, at least one source drain structure, an insulating layer, and a gate. The semiconductor substrate includes a base portion and at least one fin. The fin is disposed on the base portion. The source drain structure is disposed on at least one sidewall of the fin. The insulating layer is disposed between the base portion and the source drain structure to isolate the base portion and the source drain structure. The gate is disposed on the fin.

According to some embodiments of the present disclosure, a semiconductor structure includes a first fin, a second fin, an STI structure, a gate, and an insulating layer. The STI structure is disposed between the first fin and the second fin. The gate is disposed on at least one of the first fin and the second fin. The insulating layer is disposed between the gate and the STI structure and in contact with at least one sidewall of the STI structure.

According to some embodiments of the present disclosure, a method for manufacturing a semiconductor structure includes the following operations. An STI structure and at least one source drain structure on a base portion of a semiconductor substrate are respectively formed. At least one cap is formed to cover a head portion of the source drain structure. At least a part of the STI structure is removed to expose a lower portion of the source drain structure. The lower portion is disposed between the head portion and the semiconductor substrate. The lower portion of the source drain structure is removed. The cap is removed after the lower portion of the source drain structure is removed. An insulating layer is formed at least between the head portion of the source drain structure and the base portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a semiconductor substrate, comprising;
      a base portion; and
      at least one fin disposed on the base portion;
   at least one source drain structure disposed on at least one sidewall of the fin;
   an insulating layer disposed between the base portion and the source drain structure to isolate the base portion and the source drain structure;
   at least one residue doped region disposed between the base portion and a portion of the insulating layer disposed under the source drain structure; and
   a gate disposed on the fin.

2. The semiconductor structure of claim 1, wherein source drain structure comprises:
   a head portion; and
   a root portion disposed between the insulating layer and the head portion.

3. The semiconductor structure of claim 2, wherein the root portion of the source drain structure is in contact with the insulating layer.

4. The semiconductor structure of claim 1, further comprising at least one spacer disposed on at least one sidewall of the source drain structure.

5. The semiconductor structure of claim 4, further comprising:
   a shallow trench isolation (STI) structure at least disposed between the spacer and the base portion.

6. The semiconductor structure of claim 5, wherein a bottom surface of the spacer is separated from the STI structure.

7. The semiconductor structure of claim 1, wherein the source drain structure is doped.

8. The semiconductor structure of claim 1, further comprising an STI structure at least disposed adjacent to the residue doped region.

9. A semiconductor structure, comprising:
   a first fin formed with a recess therein defined by a fin surface;
   a second fin;
   an isolation structure disposed between the first fin and the second fin;
   a gate disposed on at least one of the first fin and the second fin;
   a source drain structure in the recess in the first fin; and
   an insulating layer in the recess in the first fin, disposed between the fin surface and the source drain structure.

10. The semiconductor structure of claim 9, wherein the insulating layer is in contact with a bottom surface of the gate.

11. The semiconductor structure of claim 9, wherein the insulating layer is in contact with the first fin.

12. The semiconductor structure of claim 9, wherein the insulating layer is further disposed between the isolation structure and the source drain structure.

13. A semiconductor structure, comprising:
   a substrate having a semiconductor fin formed with a recess therein defined by a fin surface;
   an epitaxy structure in the recess in the semiconductor fin, wherein a bottom surface of the epitaxy structure is separated from the fin surface of the semiconductor fin; and
   a gate stack over the semiconductor fin.

14. The semiconductor structure of claim 13, further comprising an interlayer dielectric surrounding the epitaxy structure and extending to between the substrate and the epitaxy structure.

15. The semiconductor structure of claim 14, wherein the bottom surface of the epitaxy structure is in contact with the interlayer dielectric.

16. The semiconductor structure of claim 14, further comprising an epitaxy residue between the substrate and the interlayer dielectric.

17. The semiconductor structure of claim 14, further comprising a gate spacer abutting a sidewall of the gate stack, wherein the interlayer dielectric is between the substrate and the gate spacer.

18. The semiconductor structure of claim 13, further comprising:
   a plurality of spacers respectively abutting sidewalls of the epitaxy structure.

19. The semiconductor structure of claim 18, further comprising:
   an interlayer dielectric surrounding the epitaxy structure and extending to between the spacers.

20. The semiconductor structure of claim 9, further comprising a gate spacer, wherein the insulating layer is between the gate spacer and the isolation structure.

* * * * *